(12) United States Patent
Maniwa

(10) Patent No.: US 6,275,103 B1
(45) Date of Patent: Aug. 14, 2001

(54) PREDISTORTER OF AMPLIFIER AND AMPLIFYING UNIT

(75) Inventor: Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/368,671

(22) Filed: Aug. 5, 1999

(30) Foreign Application Priority Data

Sep. 2, 1998 (JP) ................................................ 10-248153

(51) Int. Cl.$^7$ ...................................................... H03F 1/26
(52) U.S. Cl. ............................................................ 330/149
(58) Field of Search ........................ 330/2, 149; 375/296, 375/297

(56) References Cited

U.S. PATENT DOCUMENTS 5,892,397 * 4/1999 Belcher et al. ..................... 330/149
6,072,364 * 6/2000 Jeckeln et al. ..................... 330/149
6,075,411 * 6/2000 Briffa et al. ........................ 330/149

FOREIGN PATENT DOCUMENTS 54-107656  8/1979 (JP) .
59-36406   2/1984 (JP) .

* cited by examiner

Primary Examiner—Steven J. Mottola
(74) Attorney, Agent, or Firm—Helfgott & Karas, P C.

(57) ABSTRACT

In a predistorter, an input signal to be inputted into an amplifier is in advance modified by a reverse characteristic of an input-to-output characteristic of the amplifier. The predistorter determines correction coefficients corresponding to one or both of a differential and an integral of the input signal so as to further modify the input signal into a final predistortion signal according to the modified input signal and the correction coefficients.

8 Claims, 14 Drawing Sheets

PREDISTORTER OF AMPLIFIER AND AMPLIFYING UNIT

BACKGROUND OF THE INVENTION

1. Field of the Invention

The present invention relates to a predistorter of an amplifier for mobile communication and the like, and an amplifying unit in which a predistorter is used, and more particularly to a predistorter applicable to a high-frequency power amplifier handling wideband signals.

2. Description of the Related Art

In mobile communication, a power amplifier having a low adjacent-channel leakage power (APC) is needed so as to give no disturbance to an adjacent channel thereof. Conventionally, in order to meet the need, an output back-off method by which output power of the amplifier is reduced to the extent of the adjacent-channel leakage power becoming small, or a predistortion method (Japan Application No. Hei09-2979297) by which a transmitting signal is in advance modified by the reverse characteristic of an input-to-output characteristic and then inputted into an amplifier, is employed to linearize the transmitting signal.

With respect to the amplifier, a larger output corresponds to a higher efficiency. However, since the output back-off method reduces the output of the amplifier, a high efficiency of the amplifier cannot be obtained. Hence, it is desirable to employ the predistortion method.

FIG. 15 shows a predistorter of the predistortion method. In this diagram, an input baseband signal is modified in a predistorter 21 and then the modified signal is inputted into a transmitter 23 via a D/A converter 22. The transmitter 23 has a built-in power amplifier which can amplify an input signal power to become a transmitting power. In general, the power amplifier has a nonlinear characteristic f(x). The predistorter 21 is a circuit which modifies the input signal by a reverse characteristic $f(x)^{-1}$ of the nonlinear characteristic f(x). The input signal, which has been modified by the predistorter 21, is further modified by the nonlinear characteristic f(x) of the power amplifier of the transmitter 23. As a result, the input signal is linearized back to its initial linear state.

FIG. 16 shows a conventional example of the predistorter 21. In this example, quadrature-modulation signals I and Q are inputted as baseband signals. In FIG. 16, an amplitude-value operating portion 1 functions to obtain an amplitude value of the baseband input signals I and Q according to a formula "$I^2+Q^2$". A reverse-characteristic adding portion 2 functions to in advance modify the amplitude value ($I^2+Q^2$) by the reverse characteristic $f(x)^{-1}$ of the nonlinear characteristic f(x) of the power amplifier. Multiplying portions function to respectively multiply the input baseband signals I and Q by a signal which has had added thereto the reverse characteristic $f(x)^{-1}$ in the reverse-characteristic adding portion 2. Thus, the signals I and Q become final predistortion signals Ipd and Qpd.

It is well known that distortion is generated based on the nonlinearity of the input-to-output characteristic of the amplifier. Further, in a case in which a transmitting signal becomes a wideband signal, the distortion is enlarged due to factors such as frequency characteristics of a bias circuit, frequency deviation, high-frequency load characteristic deviation and the like of the amplifier. These factors are other than the above-mentioned nonlinearity of the input-to-output characteristic. For this reason, in order to obtain an adjacent-channel leakage power characteristic which is the same as for a narrowband, output of the amplifier must be lowered. As a result, the amplifier works inefficiently.

FIGS. 9 and 10 are graphs for comparing a narrowband signal and a wideband signal in adjacent-channel leakage power. FIG. 9 shows a spectrum of the adjacent-channel leakage power of the narrowband signal. FIG. 10 shows a spectrum of the adjacent-channel leakage power of the wideband signal. As seen from the two graphs, in order to obtain the same adjacent-channel leakage power characteristic as that of the narrowband signal of FIG. 9, the wideband signal of FIG. 10 should be lowered by about −6 dB.

However, only using the conventional linearization method cannot lower the adjacent-channel leakage power caused by the wideband.

Further, with respect to linear compensation, if output power, frequency, or temperature of the transmitter is varied, a stable reduction of the adjacent-channel leakage power cannot be obtained and the efficiency of the amplifier cannot be improved even in linear areas.

SUMMARY OF THE INVENTION

It is a general object of the present invention to provide a predistorter of an amplifier and an amplifying unit, in which the above disadvantages are eliminated.

A more specific object of the present invention is to provide a predistorter of an amplifier for mobile communication and the like and an amplifying unit using the predistorter, and more particularly to a predistorter suitable for a high-frequency power amplifier handling wideband signals.

The above objects of the present invention are achieved by a predistorter of an amplifier for lowering adjacent-channel leakage power of an output of the amplifier, the predistorter comprising:

a first part which modifies in advance an input signal to be inputted into the amplifier by a reverse characteristic of an input-to-output characteristic of the amplifier; and a second part which determines correction coefficients corresponding to one or both of a differential and an integral of the modified input signal so as to further modify the input signal into a final predistortion signal based on the modified input signal and the correction coefficients.

With respect to distortion caused by factors such as frequency characteristics of a bias circuit, frequency deviation, high-frequency load characteristic deviation and the like of the amplifier in a case in which the signal is a wideband signal, by modifying the input signal according to the correction coefficients, the adjacent-channel leakage power generated by the wideband signal can be lowered.

The predistorter may be configured such that the correction coefficients are determined based on a difference signal instead of one or both of the differential and integral of the input signal, the difference signal being generated between a previous value and a present value in time series of the input signal.

Accordingly, it is possible to realize a memory-saving high-speed process.

Further the predistorter may be configured such that the correction coefficients is in advance determined so as to meet a pre-measured two-wavelength IMD characteristic, and stored in a memory.

It is difficult to analytically obtain the correction coefficients, but using the predistorter of the present invention, the correction coefficients can be simply obtained.

The above objects of the present invention may be achieved by an amplifying unit comprising:

an amplifier; and a predistorter of the amplifier for lowering adjacent-channel leakage power of an output of the amplifier, the predistorter comprising:

a first part which modifies in advance an input signal to be inputted into the amplifier by a reverse characteristic of an input-to-output characteristic of the amplifier; and a second part which determines correction coefficients corresponding to one or both of a differential and an integral of the modified input signal so as to further modify the input signal into a final predistortion signal based on the modified input signal and the correction coefficients.

wherein coefficients are determined according to output power of the amplifier, and by arithmetically processing the input signal and the coefficients, the input signal can be modified according to the output power of the amplifier.

In the amplifying unit of the present invention, according to the size of the output power as a target, the input signal is multiplied by the coefficient so as to be modified, and thereby the adjacent-channel leakage power can be lowered with respect to a wide output range.

The above objects of the present invention may be achieved by an amplifying unit comprising:

an amplifier;

a feedback circuit; and a predistorter of the amplifier for lowering adjacent-channel leakage power of an output of the amplifier, the predistorter comprising:

a first part which modifies in advance an input signal to be inputted into the amplifier by a reverse characteristic of an input-to-output characteristic of the amplifier; and a second part which determines correction coefficients corresponding to one or both of a differential and an integral of the modified input signal so as to further modify the input signal into a final predistortion signal based on the modified input signal and the correction coefficients;

the feedback circuit monitoring a signal of a channel adjacent to an output signal of the amplifier and modifying coefficients of the predistorter so as to lower the level of the adjacent-channel signal.

Hence, an amplifying unit can be realized, which unit has a lower adjacent-channel leakage power and can compensate for variations in is frequency, input level, temperature and the like.

The above objects of the present invention may be achieved by an amplifying unit comprising:

an amplifier; and a predistorter of the amplifier for lowering adjacent-channel leakage power of an output of the amplifier, the predistorter comprising:

a first part which modifies in advance an input signal to be inputted into the amplifier by a reverse characteristic of an input-to-output characteristic of the amplifier; and a second part which determines correction coefficients corresponding to one or both of a differential and an integral of the modified input signal so as to further modify the input signal into a final predistortion signal based on the modified input signal and the correction coefficients, wherein an output current of the amplifier is monitored, and, in a case in which adjacent-channel leakage power is low, a value of power voltage or a bias is varied so as to lower a current value, so that efficiency of the amplifier can be improved in an allowable range of the adjacent-channel leakage power.

Thus, in order to monitor the current value of the amplifier and control the adjacent-channel leakage power within an allowable range, the value of the power voltage or the bias of the amplifier is varied so as to lower the current value. Thereby, the efficiency of the amplifier can be improved.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
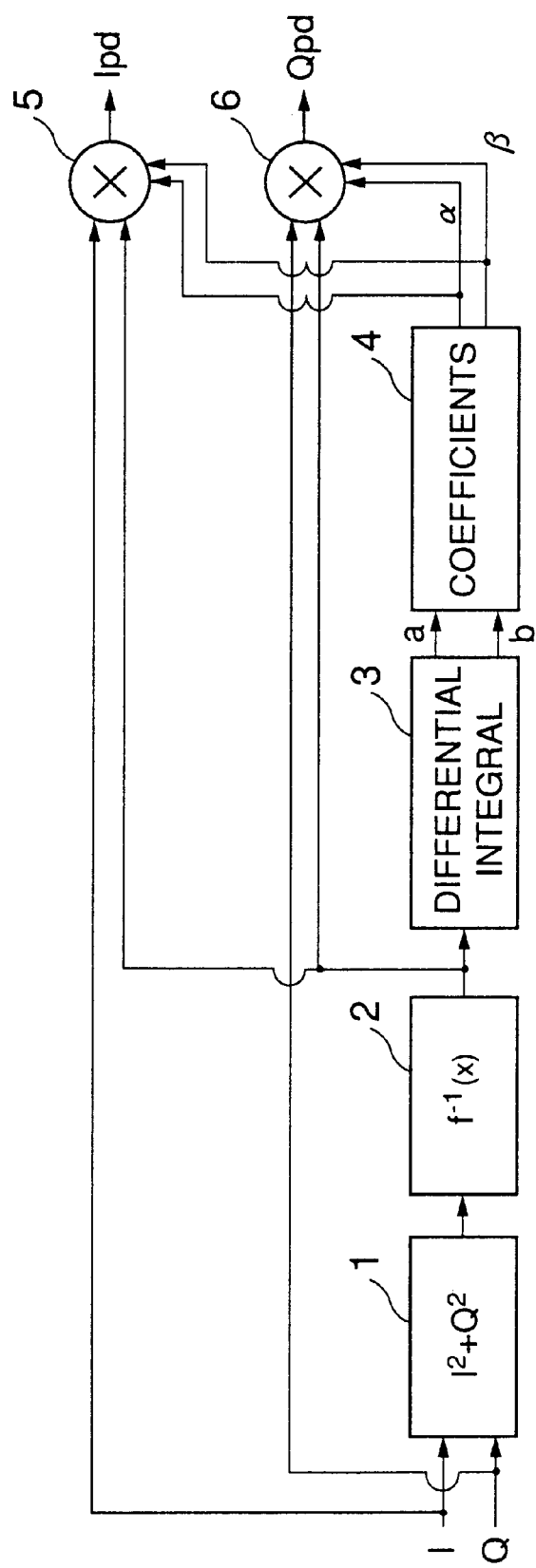
FIG. 1 is a block diagram of a predistorter of an embodiment according to the present invention.

FIG. 1 is a block diagram illustrating a predistorter of an embodiment according to the present invention.

The predistorter is applicable to a transmitter which performs quadrature modulation of a channel I and a channel Q. In the predistorter, signals I, Q of the signal-transmitting channels I, Q are in advance modified to be predistorter signals by a reverse characteristic $f(x)^{-1}$ of an input-to-output characteristic $f(x)$ of an amplifier, and then the predistorter signals are inputted into the amplifier. In the present invention, the predistorter signals are further modified by correction coefficients for compensating for an influence of a wideband signal and finally become predistorter signals Ipd and Qpd.

In FIG. 1, an amplitude operating portion 1 functions to obtain an amplitude value of the baseband input signals I and Q according to a formula "$I^2+Q^2$".

A reverse-characteristic adding portion 2 functions to modify the amplitude value $(I^2+Q^2)$ by the reverse characteristic $f(x)^{-1}$ of the input-to-output characteristic $f(x)$ of the amplifier (not shown), that is, perform multiplication of $(I^2+Q^2)$ by $f(x)^{-1}$.

In this embodiment, the amplitude operating portion 1 and reverse-characteristic adding portion 2 are regarded as a first part of the predistorter which modifies in advance the input signals I and Q to be inputted into the amplifier by the reverse characteristic of the input-to-output characteristic of the amplifier.

A differential and integral operating portion 3 functions to differentiate and integrate the signal, which has been predistorted by the reverse characteristic $f(x)^{-1}$ in the reverse-characteristic adding portion 2, so as to output a differential signal "a" and an integral signal "b".

A coefficient generating portion 4 functions to generate a coefficient α corresponding to a value of the differential signal "a" and a coefficient β corresponding to a value of the integral signal "b". The coefficient generating portion 4, in a form of a memory table, stores the coefficients α and β respectively corresponding to the differential signal "a" and the integral signal "b".

Reference numerals 5, 6 denote multiplying portions which function to respectively multiply the input baseband signals I and Q by the signal predistorted by the reverse characteristic $f(x)^{-1}$ in the reverse characteristic adding portion 2 as well as by the coefficients α and β generated in the coefficient generating portion 4. Signals outputted from the multiplying portions 5, 6 finally become the predistortion signals Ipd and Qpd which are inputted into the amplifier.

In this embodiment, the differential and integral operating portion 3, coefficient generating portion 4, and multiplying portions 5 and 6 are regarded as a second part of the predistorter which determines the correction coefficients corresponding to one or both of the differential and the integral of the modified input signals I and Q so as to further modify the input signals I and Q into the final predistortion signals Ipd and Qpd based on the modified input signals I and Q and the correction coefficients.

As mentioned above, the baseband input signals I and Q are predistorted by the reverse characteristic $f(x)^{-1}$ of the amplifier and thereby a distortion caused by the nonlinearity of the amplifier can be compensated for and, at the same time, a distortion caused by the wideband of the signals I and Q can be compensated for by the correction coefficients α and β. These distortions are thus removed.

Next, a principle of the embodiment according to the present invention will be described.

Figure 2:
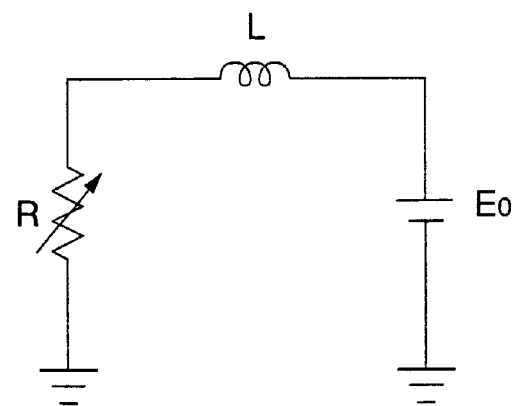
FIG. 2 is a block diagram of an equivalent circuit of a simplified amplifying element and a bias circuit.

A matching circuit or a bias circuit of the amplifier has frequency characteristics. For example, FIG. 2 shows a bias circuit which is extremely simplified. In FIG. 2, reference character $E_0$ denotes a voltage source, L an inductance of the bias circuit, and R(t) an equivalent resistance of an amplifying element. The amplifying element is usually regarded as a current source, but herein is regarded as the resistance R(t) varying according to input power and thereby the principle of the embodiment can be understood easily.

By including the influence of the inductance L of the bias circuit, a voltage V(t) applied to the amplifying element can be obtained according to the following formula:

$$V(t)=R(t) \cdot I(t)=E_0-L \cdot (dI(t)/dt) \qquad \text{(formula 1)}$$

Current value I(t) can be obtained by the differential equation. In a case in which a modulation frequency is low, a differential coefficient (dI(t)/dt) of the current value I(t) is so small that it may be regarded as the value "0". On the other hand, in a case of a wideband signal, the modulation frequency is so high that the inductance L may be an influence.

That is, if formula 1 is divided by the resistance R(t), then $$I(t)=E_0/R(t)-[(L/R(t)) \cdot (dI(t)/dt)] \qquad \text{(formula 2)}$$

Herein, $$I=I_0+\Delta I \qquad \text{(formula 3)}$$

$$I_0=E_0/R(t) \qquad \text{(formula 4)}$$

(As shown by formular 4, $I_0$ is regarded as an electric current without the influence of the inductance L). If $\Delta I$ is small, then $$I=I_0[1+(L/R(t)^2) \cdot (dR(t)/dt)] \qquad \text{(formula 5)}$$

Since the resistance R(t) is measured as a function of input power $P_i$, $$I=I_0[1+(L/R(t)^2) \cdot (dR(t)/dP_i) \cdot (dP_i/dt)] \qquad \text{(formula 6)}$$

That is, when the influence of the inductance L appears due to the wideband signal, an electric current I flowing through the amplifying element can be obtained such that the current $I_0$ independent of the influence of the inductance L is multiplied by a coefficient. The coefficient is the parenthesized part of formula 6. Herein, since a variation ratio of the current I is approximately equal to that of a gain, a gain characteristic of the amplifier concerning the wideband signal can be obtained from formula 6. In order to remove a distortion from the output of the amplifier based on the gain characteristic, the input signals of the amplifier are modified by a characteristic reverse to the distortion so that the distortion caused by the wideband signals can be removed from a final output of the amplifier.

In other words, if the resistance R(t) and the differential coefficient $(dR(t)/dP_i)$ of the input power $P_i$ are in advance obtained from an input-to-output characteristic of a carrier wave CW, then a reciprocal of the value $(L/R(t)^2) \cdot (dR(t)/dP_i)$ in the parenthesis of formula 6 corresponding to the differential coefficient may be in advance stored in a memory as a correction value. The differential value $(dP_i/dt)$ of the input power $P_i$ is inputted into the memory as an address so that a corresponding correction value can be obtained. Thus, the distortion can be corrected.

Figure 3:
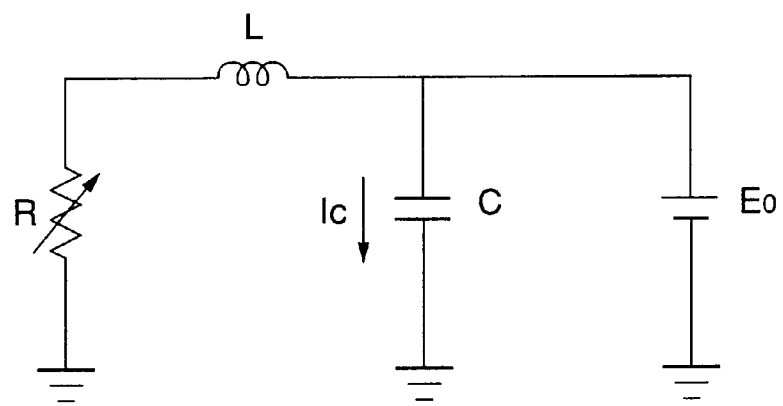
FIG. 3 is a block diagram of a circuit more actually equivalent to the amplifying element and the bias circuit.

In addition, as shown in FIG. 3, in an equivalent circuit of an actual amplifying element and a bias circuit, to represent the influence of a high-frequency load circuit including a capacitor C, the following integral is needed.

$$I_c+(1/C) \cdot I_c \, dt = I \cdot R \qquad \text{(formula 7)}$$

In the embodiment of FIG. 1, the input signal ($I^2+Q^2$) is not only differentiated but also integrated, and according to a differential result and an integral result, correction values coefficients α,β) are generated.

Thus, in an actual circuit, since both the differential and integral of the input signals are needed, or an approximation such as that in formula 3 is unavailable, it is very difficult to analytically obtain the correction values.

Figure 4:
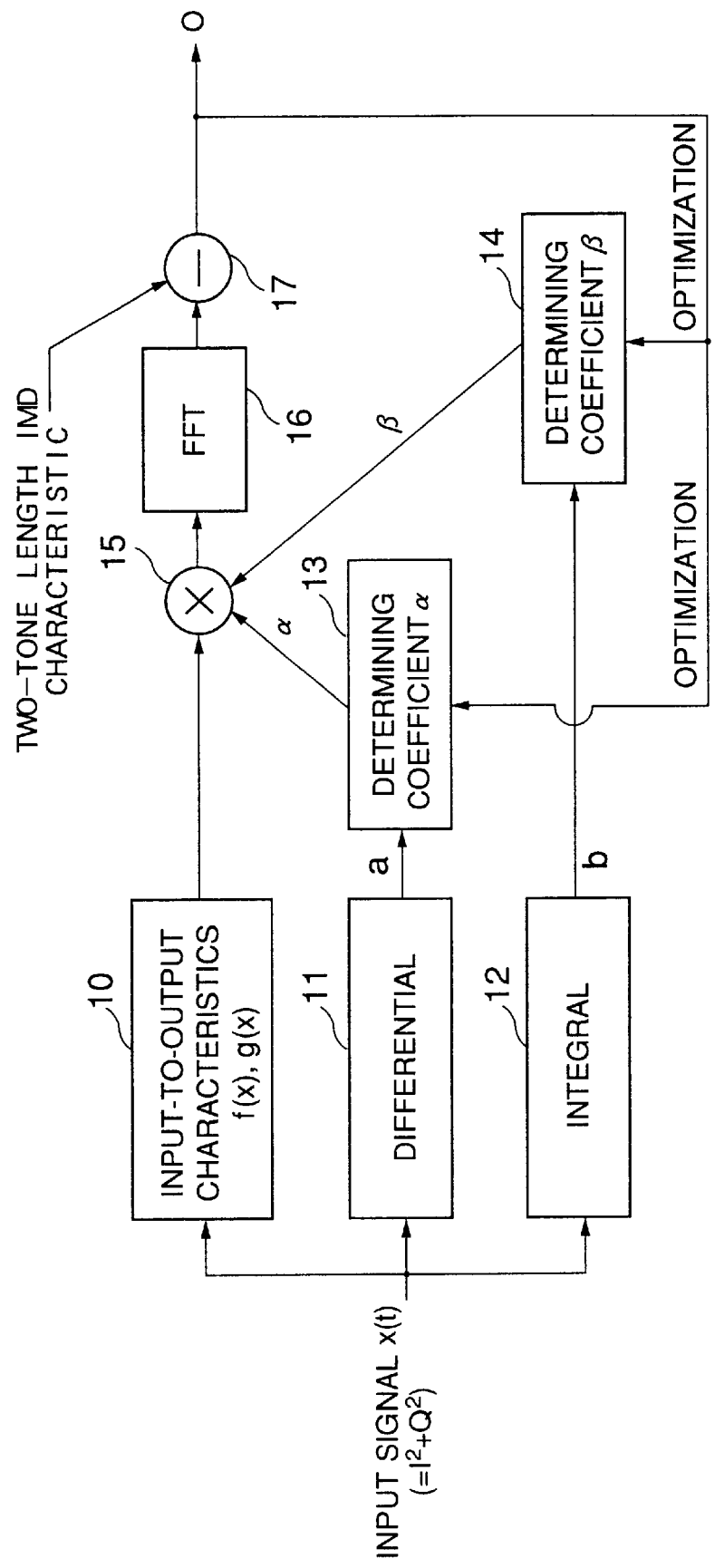
FIG. 4 is a block diagram showing a coefficient determining method of the predistorter of the embodiment according to the present invention.

For this reason, in place of the analytical method for determining coefficients, a efficient-determining method shown in FIG. 4 is desirable. In this method of FIG. 4, the coefficients are determined such that an intermodulation distortion (IMD) characteristic of two-tone which is separated by several MHz's from the input signals matches a desired two-tone IMD characteristic which is in advance measured and stored in a memory.

In FIG. 4, an amplitude ($I^2+Q^2$) of the baseband signals I and Q is regarded as an input signal x(t). With respect to the input signal x(t), an input-to-output characteristic operating portion 10 supplies a multiplying portion 15 with an amplitude characteristic function f(x) and a phase characteristic function g(x) of the amplifier.

Moreover, the input signal x(t) is inputted into a differential operating portion 11 and then the differential operating portion 11 outputs a differential signal "a" as a differential result into a coefficient α determining portion 13. At the same time, the input signal x(t) is inputted into an integral operating portion 12 and the integral operating portion 12 outputs an integral signal "b" as an integral result into a coefficient β determining portion 14.

The coefficient α determining portion 13 determines each of constants A, B, C, D and others by a later-described method, corresponding to the inputted differential signal "a". The coefficient α is obtained according to the following formula:

$$\alpha = A + Ba + Ca^2 + Da^3 + Ea^4 + \ldots$$

Then the obtained coefficient α is inputted into the multiplying portion 15 in which the signal from the input-to-output characteristic operating portion 10 is multiplied by the coefficient α.

Similarly, The coefficient β determining portion 14 determines each of constants A', B', C', D' and others by a later-described method, corresponding to the inputted differential signal "b". The coefficient β is obtained according to the following formula:

$$\beta = +A'+B'b+C'b^2+D'b^3+E'b^4+\ldots$$

Then, the obtained coefficients β is inputted into the multiplying portion 15 in which the signal from the input-to-output characteristic operating portion 10 is multiplied by the coefficient β.

A fast Fourier transformation (FFT) portion 16 is a circuit which performs a fast Fourier transformation on an output signal from the multiplying portion 15 so that the output signal is transformed into frequency components. The transformed output signal is inputted into a subtracting portion 17 from the fast Fourier transformation (FFT) portion 16.

The above-mentioned two-tone IMD characteristic is inputted into the subtracting portion 17 as another input signal. The subtracting portion 17 obtains a difference between the two-tone IMD characteristic and the output signal from the FFT portion 16. The difference signal, as a signal for optimization, is respectively inputted into the coefficient α determining portion 13 and the coefficient β determining portion 14. The coefficient α determining portion 13 and the coefficient β determining portion 14 properly vary and determine their respective constants A, B, C, D . . . and A', B', C', D'. . . until the difference signal becomes "0" or is minimized.

Figure 5:
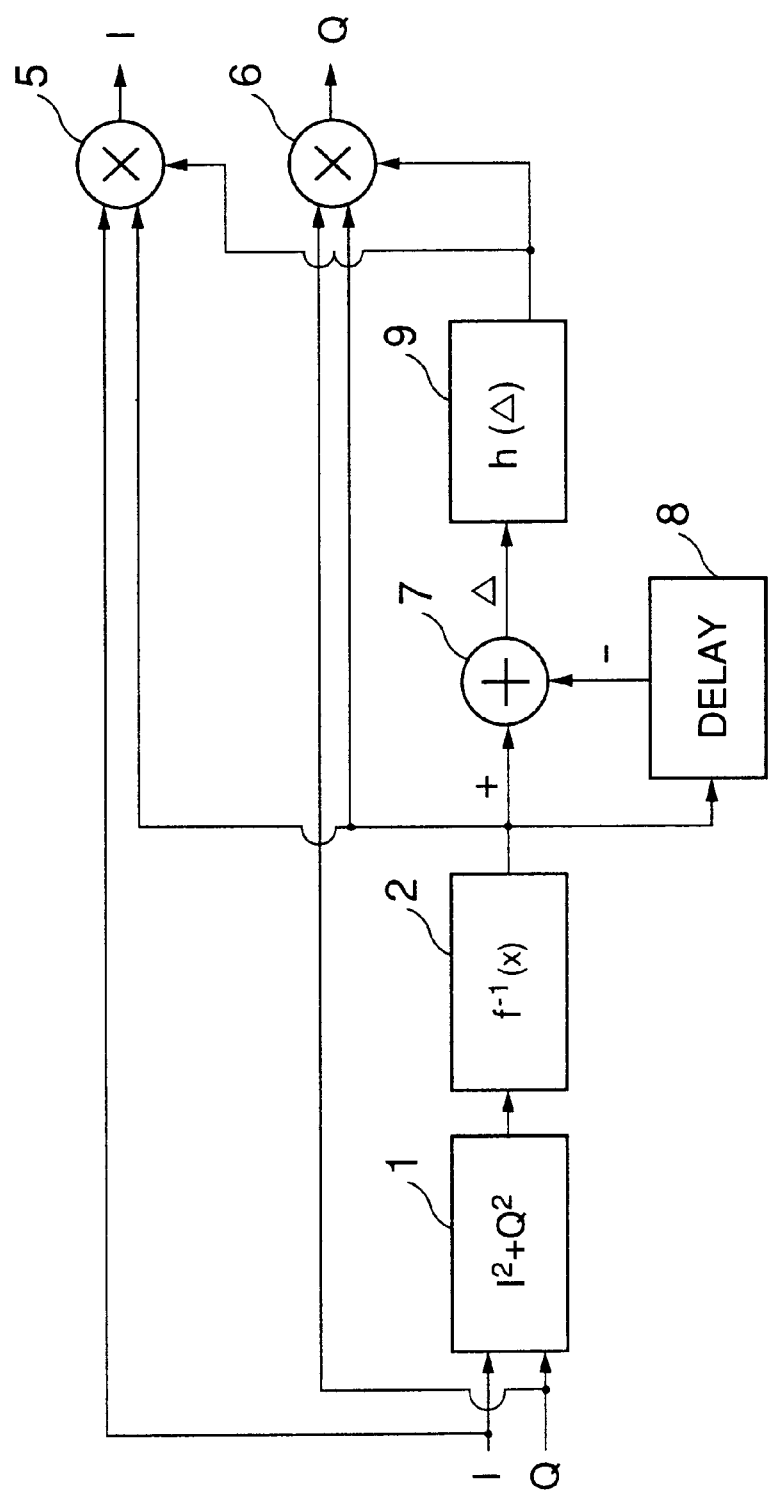
FIG. 5 is a block diagram of a predistorter of another embodiment according to the present invention.

FIG. 5 shows an example of a predistorter of another embodiment according to the present invention, which predistortor is useful for a memory-saving high-speed process by defining a difference Δ between a differentiated-and-integrated value and a signal obtained one unit time before. In this diagram, the amplitude operating portion 1, the reverse characteristic adding portion 2, and the multiplying portions 5, 6 are the same as those described in the embodiment of FIG. 1. In this embodiment, an output signal from the reverse characteristic adding portion 2 is inputted into the multiplying portions 5, 6 and, at the same time, inputted into a delaying portion 8 and a subtracting portion 7. The delaying portion 8 is a circuit for delaying an input signal by the unit time. The subtracting portion 7 is a circuit for subtracting an output signal of the delaying portion 8 from the output signal of the reverse characteristic adding portion 2, and a difference signal Δ of the subtraction is inputted into a coefficient generator 9. The coefficient generator 9 generates a coefficient h(Δ) corresponding to the inputted difference signal Δ and inputs the coefficient h(Δ) into the multiplying portions 5, 6 in which the baseband input signals I and Q are respectively multiplied by the coefficient h(Δ). Thus, a distortion based on the nonlinearity of the amplifier and a distortion based on the wideband transmitting signal are corrected for the baseband signals I and Q.

Figure 6:
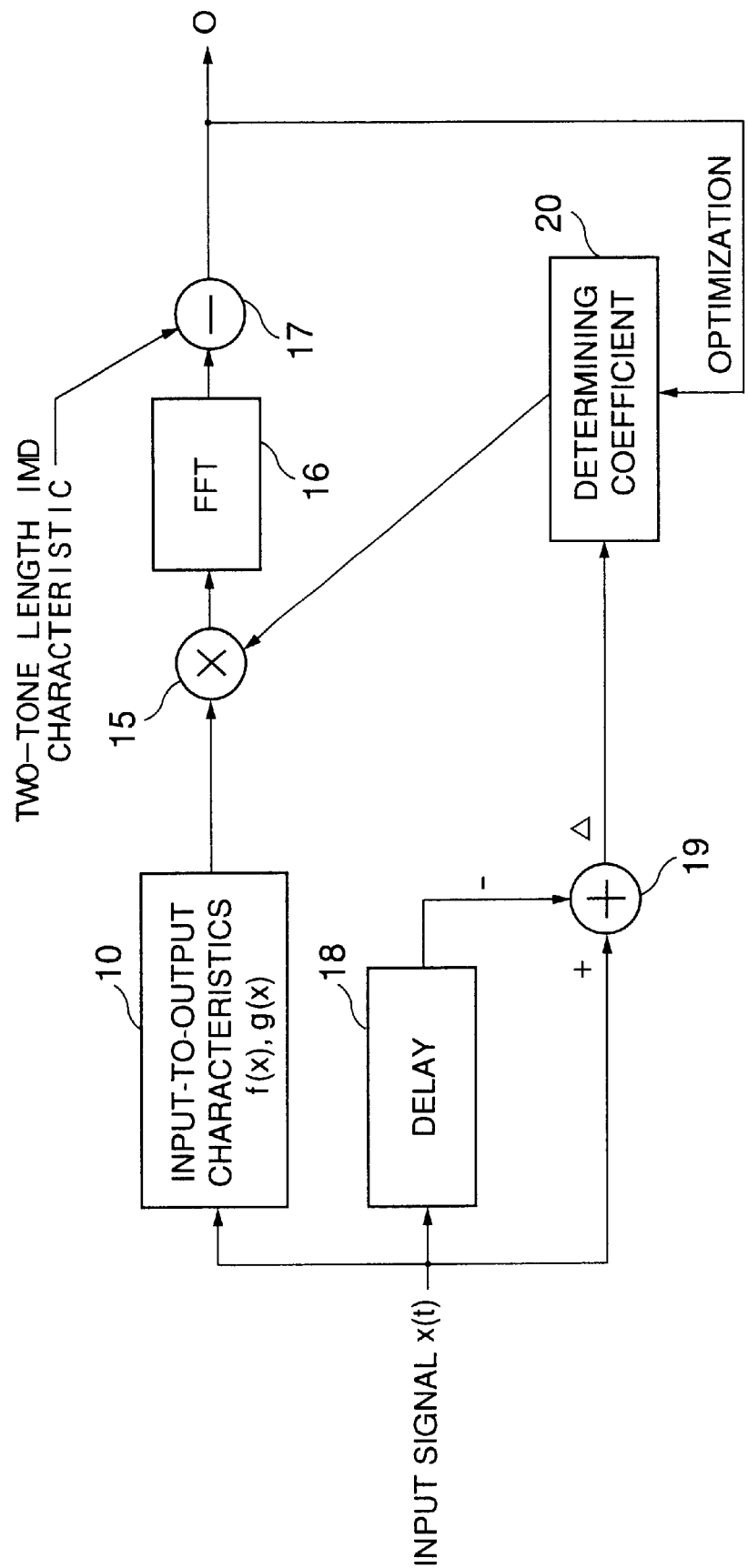
FIG. 6 is a block diagram showing a coefficient determining method of the predistorter of the embodiment according to the present invention.

FIG. 6 shows a circuit for determining a coefficient h(Δ), which circuit is similar to the coefficient-determining circuit shown in FIG. 4. The input-to-output characteristic operating portion 10, the multiplying portion 15, the FFT portion 16, and subtracting portion 17 in FIG. 6 are the same as those illustrated in FIG. 4. As a different point, the input signal x(t)(=$I^2+Q^2$) is inputted into a delaying portion 18 for delaying the input signal x(t) by the unit time and, at the same time, the input signal x(t) is inputted into a subtracting portion 19. A difference signal Δ is obtained in the subtracting portion 19 and then is inputted into a coefficient determining portion 20. The coefficient h(Δ) is obtained according to the following formula:

$$h(\Delta) = A + B\Delta + C\Delta^2 + D\Delta^3 + E\Delta^4 + \ldots$$

The coefficient determining portion 20 determines the constants A, B, C, D, E . . . so that an output signal of the subtracting portion 17 is "0" or is minimized.

Figure 7:
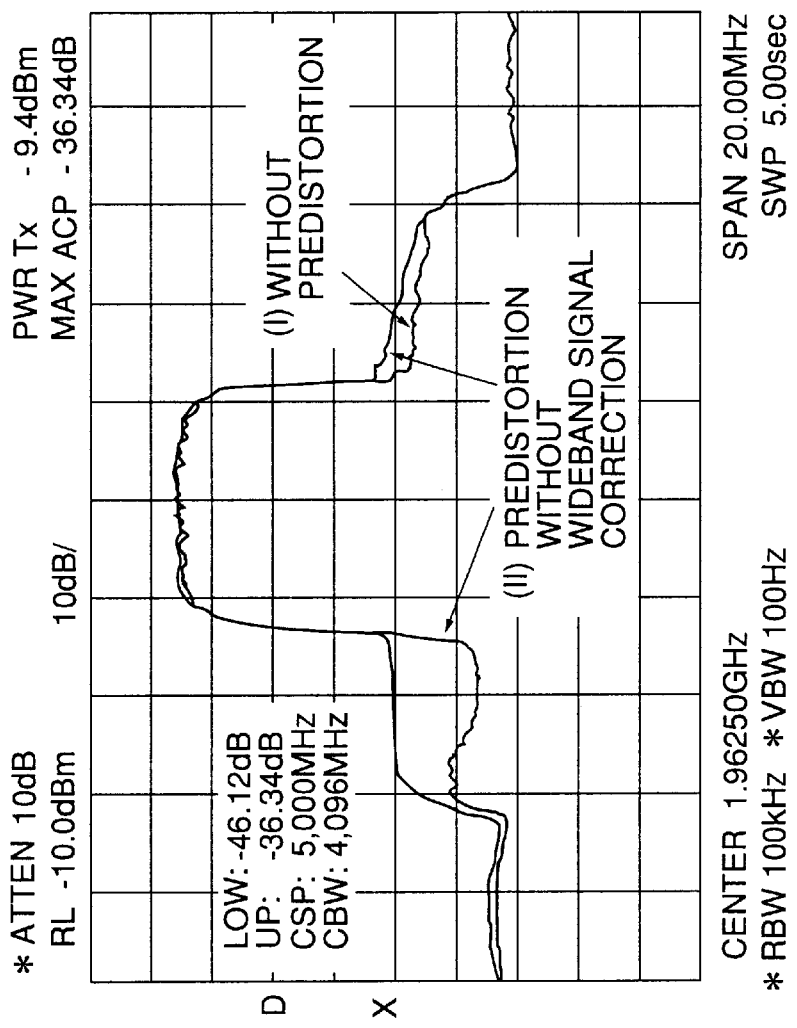
FIG. 7 is a graph, for comparing the present invention and the conventional art in reduction effect of the adjacent-channel leakage power, showing a result of predistortion by the conventional art.
Figure 8:
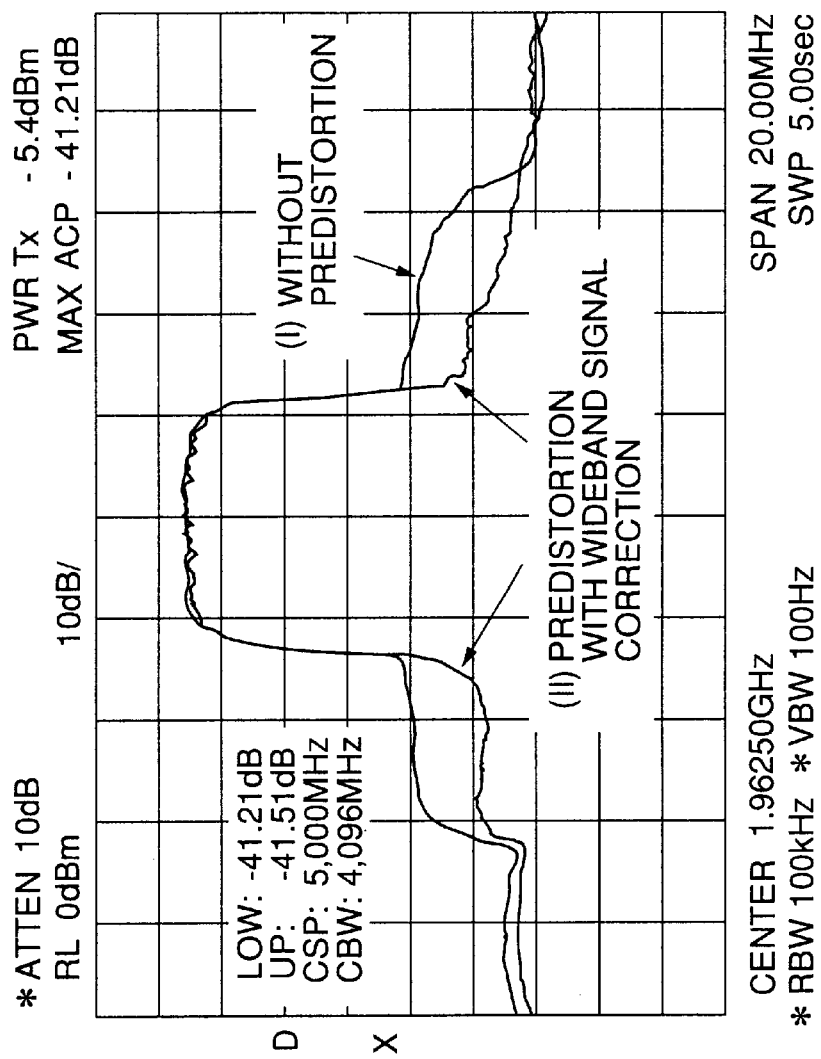
FIG. 8 is a graph, for comparing the present invention and the conventional art in reduction effect of the adjacent-channel leakage power, showing a result of predistortion by the present invention.
Figure 9:
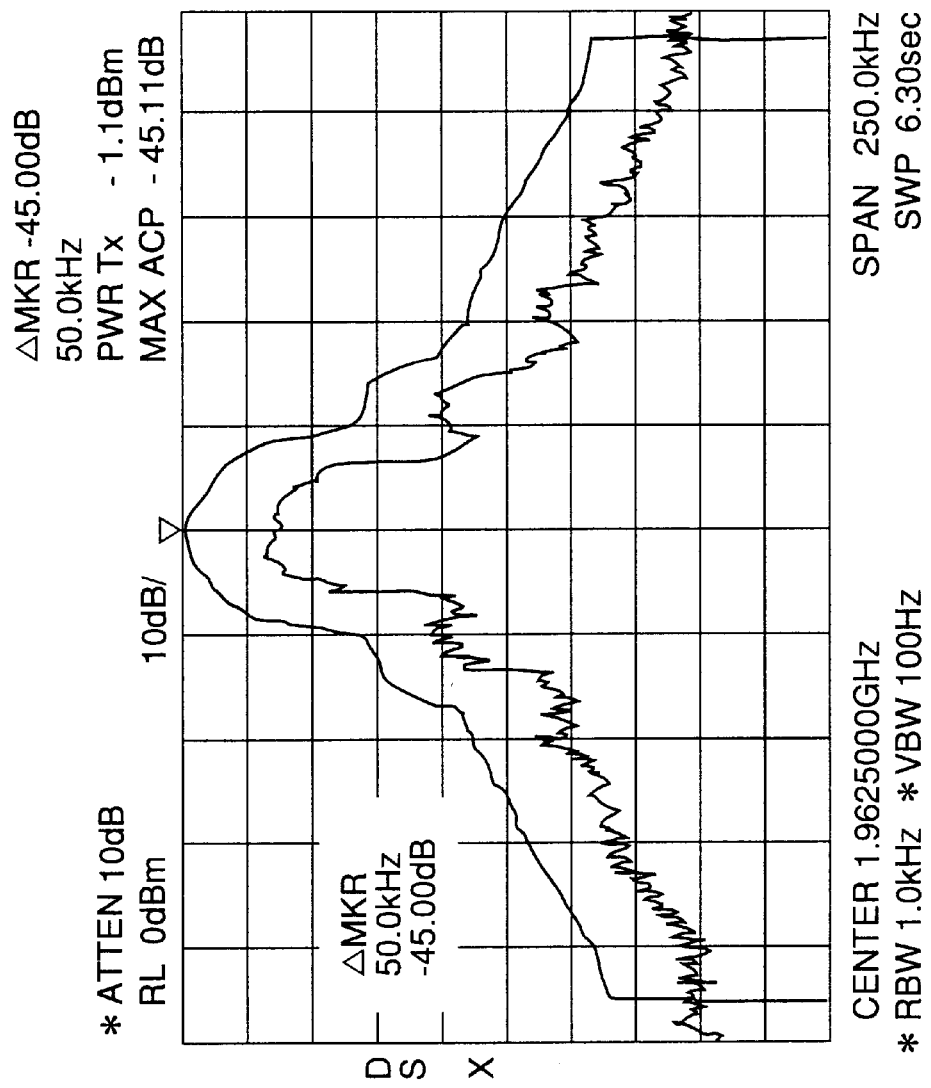
FIG. 9 is a graph, for comparing a narrowband signal and a wideband signal in the adjacent-channel leakage power, showing an example of a spectrum of the adjacent-channel leakage power of the narrowband signal.
Figure 10:
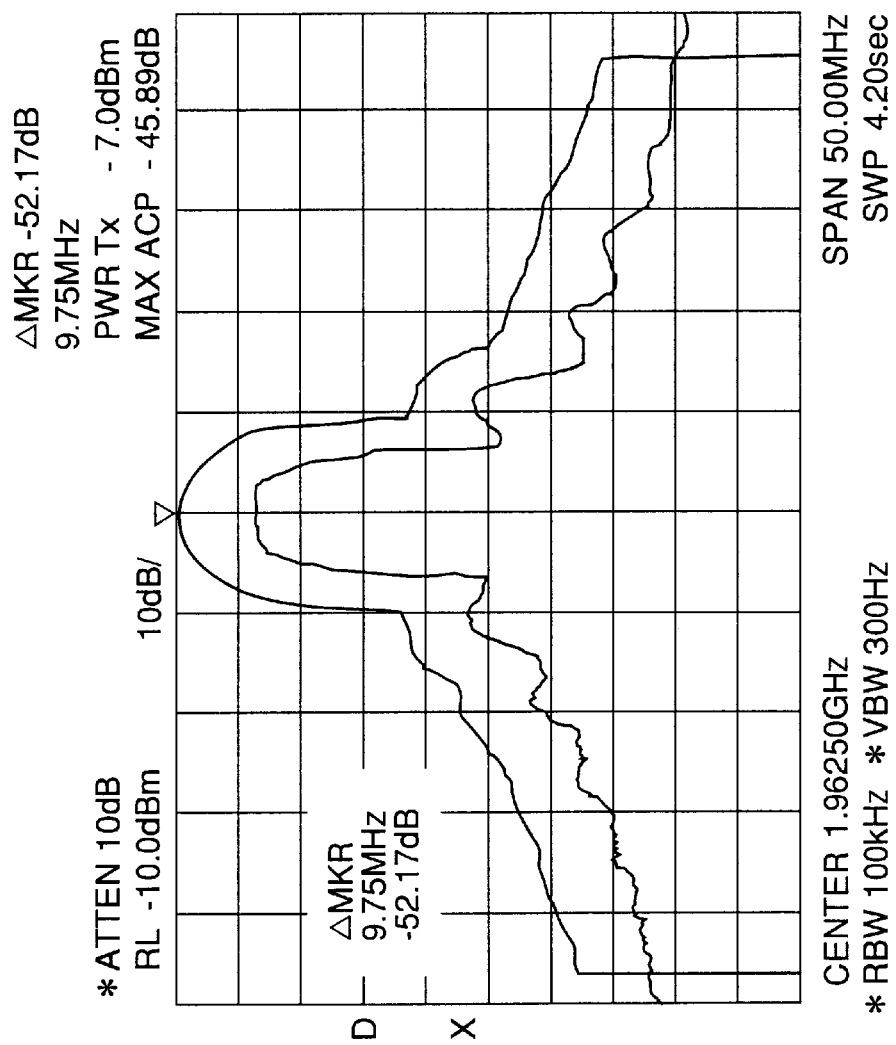
FIG. 10 is a graph, for comparing a narrowband signal and a wideband signal in the adjacent-channel leakage power, showing an example of a spectrum of the adjacent-channel leakage power of the wideband signal.

FIGS. 7 and 8 are diagrams for comparing adjacent-channel leakage power in a case in which a predistortion is performed to that in a case in which the predistortion is not performed. FIG. 7 shows a result of the predistortion performed without the above-mentioned correction for the wideband signal. In FIG. 7, reference character (I) denotes a characteristic without predistortion in which the compensation by the reverse characteristic $f(x)^{-1}$ is not performed and (II) denotes a characteristic with predistortion in which only the compensation by the reverse characteristic $f(x)^{-1}$, and not the compensation by the coefficient corresponding to the difference Δ, is performed. FIG. 8 shows a result of the predistortion performed with the above-mentioned correction. In FIG. 8, reference character (I) denotes a characteristic without predistortion in which the compensation by the reverse characteristic $f(x)^{-1}$ is not performed and (II) denotes a characteristic with predistortion in which not only compensation by the reverse characteristic $f(x)^{-1}$ but also compensation by the coefficient corresponding to the difference Δ is performed.

It is clear from these diagrams that, according to the present invention, the effect of lowering the adjacent-channel leakage power is greatly improved in the characteristic of FIG. 8 which includes the correction for the wideband signal as compared to the characteristic of FIG. 7 which does not include the correction for the wideband signal.

Figure 14:
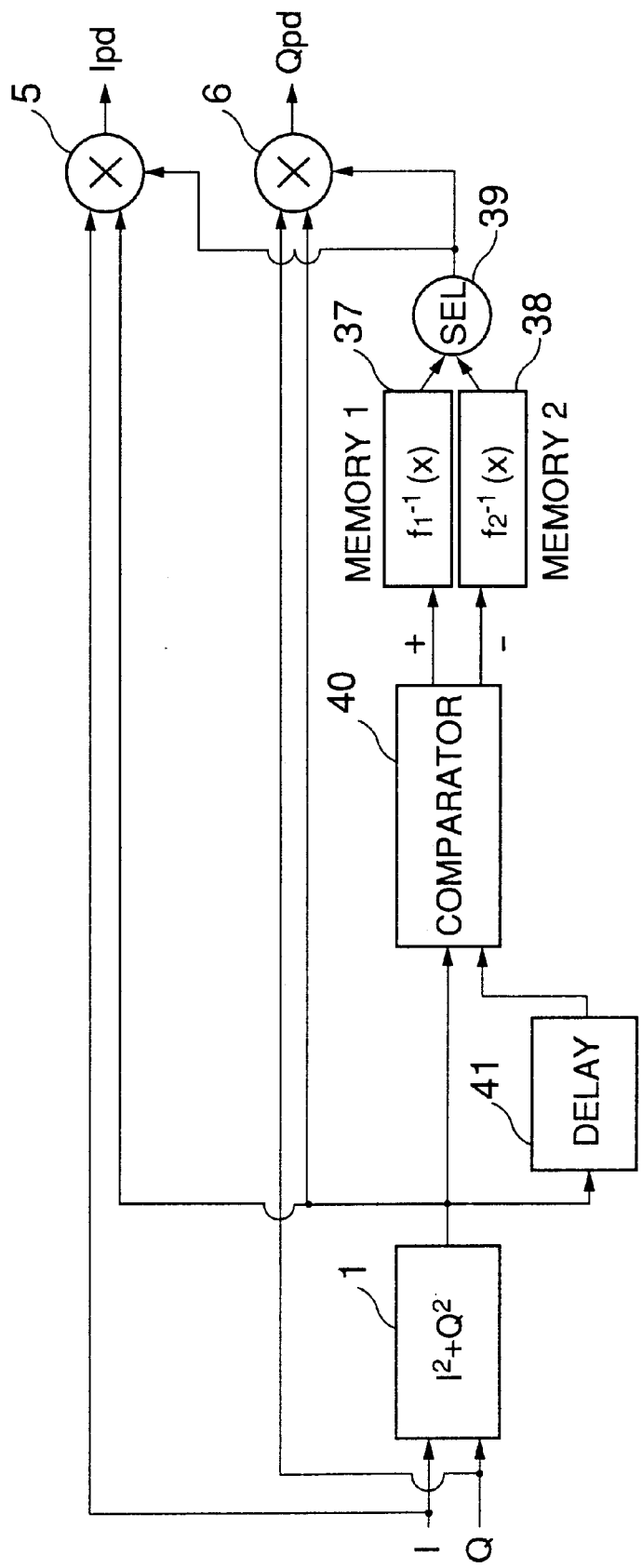
FIG. 14 is a block diagram of a predistorter improving upon the predistorter of FIG. 5.
Figure 15:
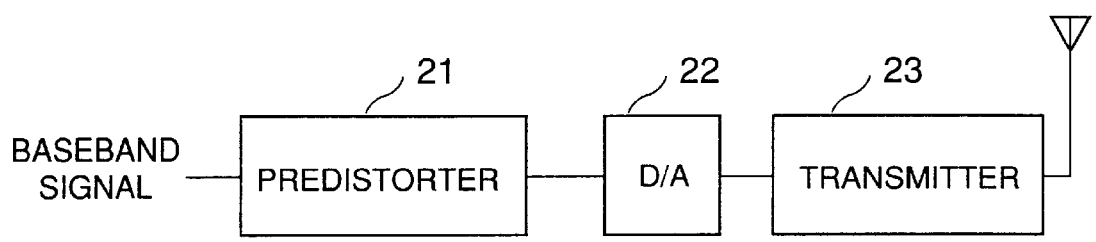
FIG. 15 is a block diagram for illustrating a conventional predistortion method.
Figure 16:
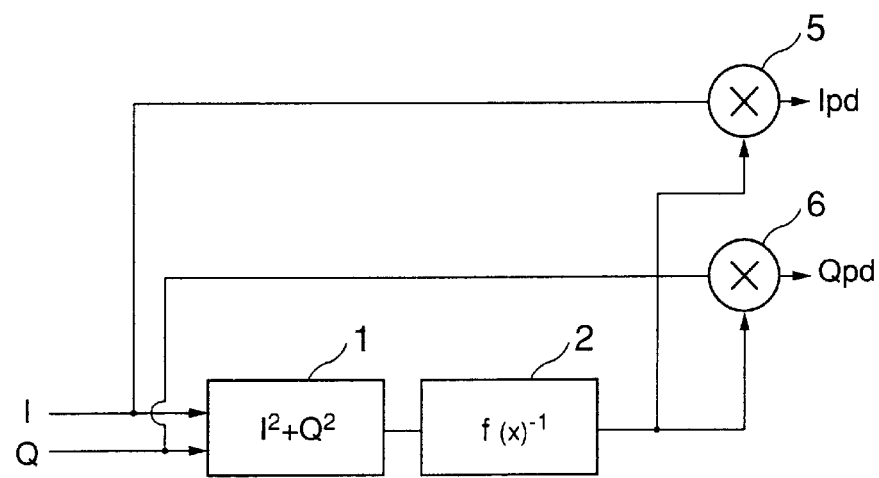
FIG. 16 is a block diagram of a conventional predistorter.

FIG. 14 shows a predistorter improving upon the predistorter illustrated in FIG. 5. In a method of using the difference of FIG. 5, a memory is needed for storing difference Δ values. The difference Δ values include plus values and minus values. The plus values mean that signals are increasing and the minus values mean that the signals are decreasing. Reverse characteristics $f_1(x)^{-1}$ and $f_2(x)^{-1}$ corresponding to the two kinds of values are stored in the memory by which the adjacent-channel leakage power can be lowered and the memory can be saved to some extent.

In FIG. 14, the amplitude operating portion 1 and multiplying portions 5, 6 are the same as those that have been described. A delaying portion 41 functions to delay a signal by one unit time. A comparator 40 functions to compare a signal from the amplitude operating portion 1 to a signal from the delaying portion 41 and judge a plus-minus result of the comparison so as to output the plus-minus result and the amplitude ($I^2+Q^2$). A reverse characteristic adding portion 37 functions to add the reverse characteristic $f_1(x)^{-1}$ to the amplitude ($I^2+Q^2$) when the comparison result of the comparator 40 is plus. A reverse characteristic adding portion 38 functions to add a reverse characteristic $f_2(x)^{-1}$ to the amplitude ($I^2+Q^2$) when the comparison result of the comparator 40 is minus. A selector 39 functions to select an output signal from the reverse characteristic adding portion 37 when the comparison result of the comparator 40 is plus, or an output signal from the reverse characteristic adding portion 38 when the comparison result of the comparator 40 is minus, and thus transmit the output signal to the respective multiplying portions 5, 6.

Next, an embodiment in which a stable effect of lowering the adjacent-channel leakage power can be obtained by using the above-mentioned predistorter even though there are variations in output power, frequency, or temperature of the transmitter, is described hereinafter.

Figure 11:
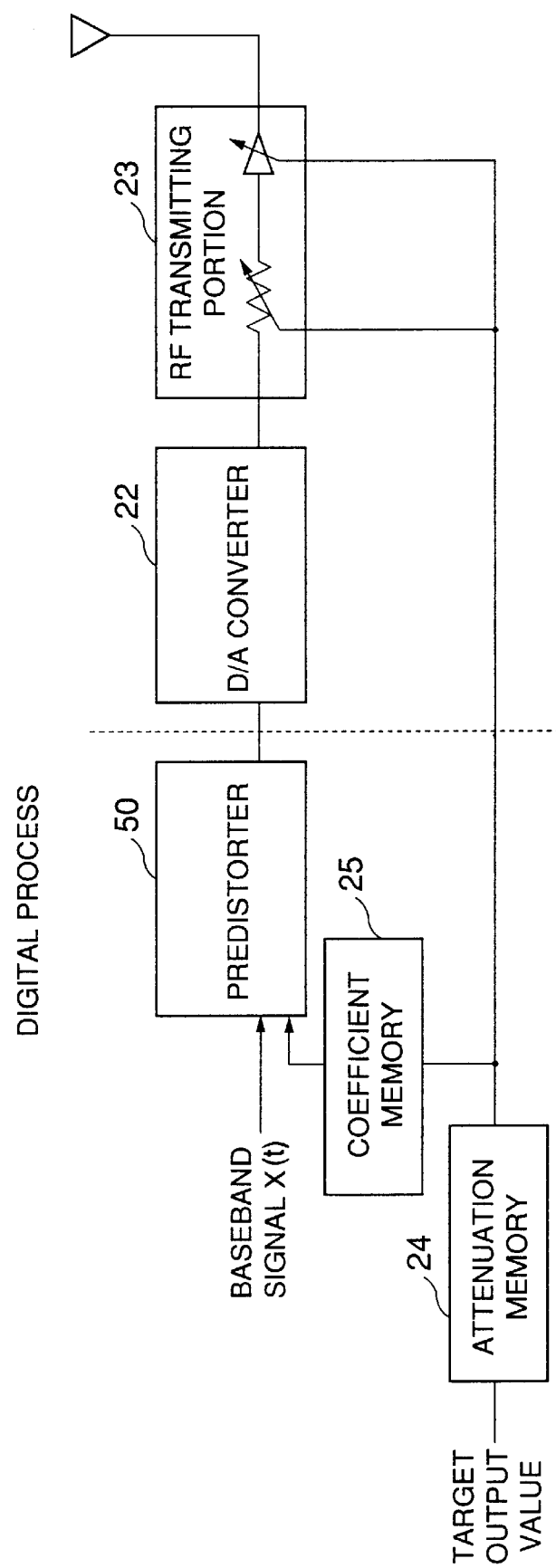
FIG. 11 is a block diagram showing an example of compensating for variation in transmitting power of a transmitter so as to lower the adjacent-channel leakage power.

FIG. 11 shows an embodiment in which a variation in output power of a transmitter 23 can be compensated for. In a case in which the output power of the transmitter 23 is variable, in general, an amplitude of signals I and Q to be inputted into the transmitter 23 is lowered. However, if so, then a dynamic range of the signals I and Q cannot be obtained and a signal-to-noise ratio will be worse. In order to avoid the problem, the signals I and Q are kept at a certain strength so that, in the transmitter 23, the output power can be changed by an attenuator or a variable gain amplifier disposed before a power amplifier. As a result of using the attenuator or the variable gain amplifier, if power to be inputted into the power amplifier drops, then a distortion of the power amplifier usually becomes small. In this embodiment, the inputted signals I and Q are predistorted and since the signals I and Q are kept at the certain strength, the adjacent-channel leakage power is increased.

In order to avoid this problem, for the target output value of the transmitter 23, an attenuation memory 24 is provided for storing a gain (attenuation or amplification degree) of the attenuator or the variable gain amplifier. The gain of the attenuator or the variable gain amplifier of the transmitter 23 is controlled by an output value of the attenuation memory 24, and, according to the output value, an amplitude value of the baseband input signal x(t) to be inputted into a predistorter 50 is adjusted.

That is, in a case in which the output power of the transmitter 23 is lowered, the target output value, via a coefficient memory 25, is inputted into the predistorter 50 for calculating the predistortion. When the target output value is small, a coefficient for correspondingly lowering the amplitude of the input signals is stored in the coefficient memory 25 as a table. The target output value is multiplied by the input signal of the amplitude operating portion 1 for calculating the amplitude of the signals I and Q, and a predistortion coefficient is thus obtained. Thereby the above-mentioned problem is solved.

Figure 12:
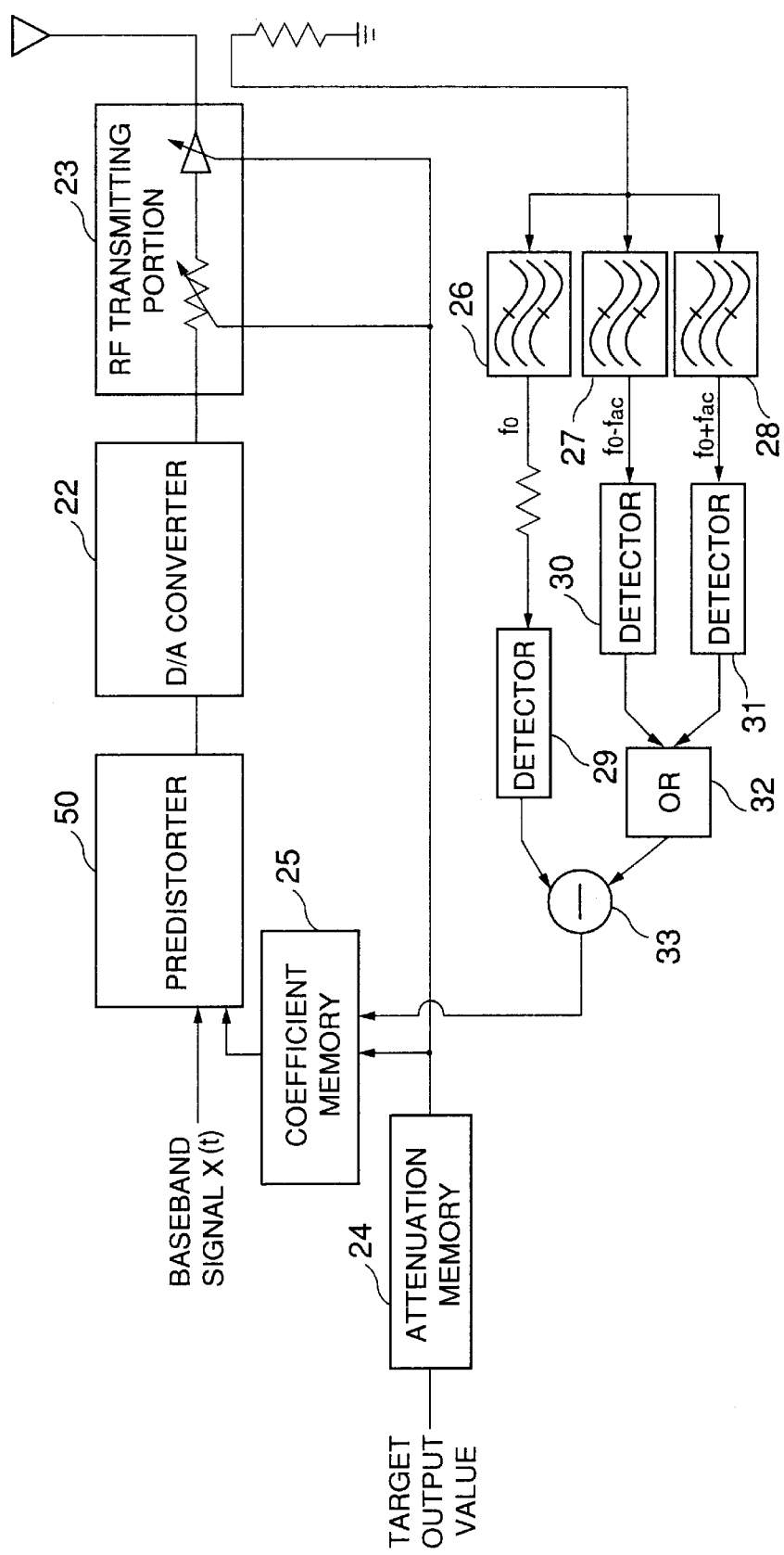
FIG. 12 is a block diagram showing an example of compensating for variation in transmitting power of the transmitter, temperature or frequency of an amplifier so as to lower the adjacent-channel leakage power.

FIG. 12 shows an embodiment in which variations in transmitting power of the transmitter as well as that in temperature or frequency of an amplifier can be compensated for.

In this embodiment, in order to compensate for the variations in the temperature or frequency of the amplifier, part of the output of the transmitter 23 is monitored, a transmitting band $f_0$ and adjacent-channel bands $f_0 \pm f_{acp}$ are separated by filters 26 to 28, and respective signal powers are detected by detectors 29 to 31. These powers are compared to each other by an OR-circuit 32 and a subtracter 33. A signal of the transmitting band $f_0$ is attenuated only when the adjacent-channel leakage power becomes a given value (not exceeding an allowable value). If the power of the transmitting band $f_0$ is smaller than that of the adjacent-channel band, values in the coefficient memory 25 for obtaining a coefficient corresponding to the target output value are changed and a coefficient table by which the signals I, Q are multiplied is changed so as to optimize the target output value.

Figure 13:
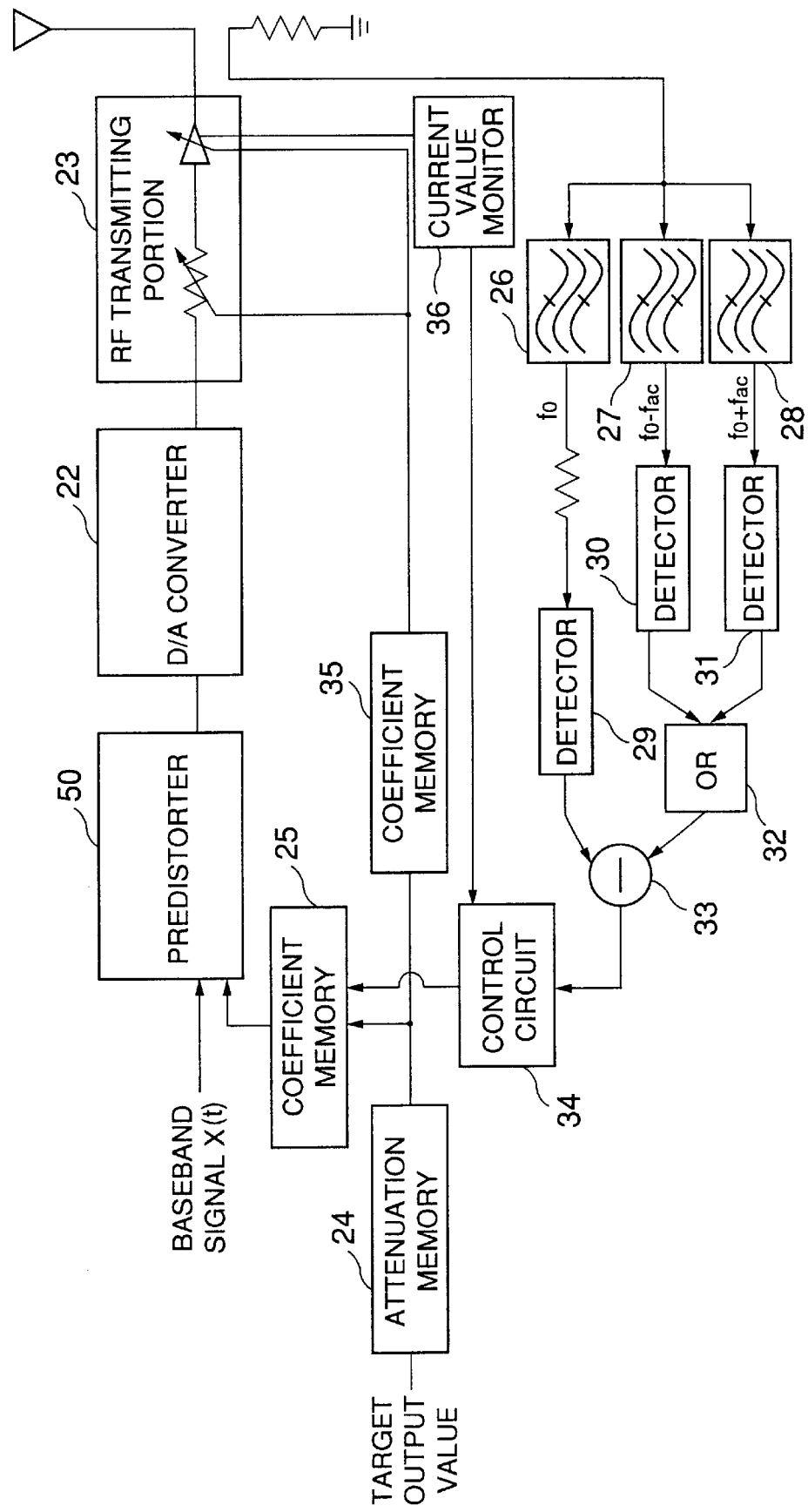
FIG. 13 is a block diagram showing an example of compensating for variation in transmitting power or outputting current of the transmitter, temperature or frequency of the amplifier so as to lower the adjacent-channel leakage power.

FIG. 13 shows an embodiment in which a value of a current flowing in a power amplifier, besides variations in the transmitting power, and temperature or frequency of the amplifier, is taken into consideration.

In this embodiment, the value of the current flowing in the power amplifier of the transmitter 23 is monitored by a monitor 36 and sent to a control circuit 34. If the adjacent-channel band is large, the control circuit 34, via the coefficient memory 25 and a coefficient memory 35, changes and raises an output value of the attenuation memory 24 for obtaining a coefficient corresponding to the target output value, changes a source voltage or a bias voltage of the power amplifier, and lowers the current of the power amplifier. Thus, the large adjacent-channel leakage power can be reduced by changing the predistortion coefficient of the predistortor 50 in the coefficient memory 25 and values in the coefficient memory 35 and therefore improve the efficiency. In this case, even though the gain of the power amplifier is reduced, reduction of the overall gain can be prevented by raising the gain of the attenuator positioned before the power amplifier and the variable gain amplifier.

The present invention is not limited to the specifically disclosed embodiments, and variations and modifications may be made without departing from the scope of the present invention.

The present application is based on Japanese priority application No. 10-248153 filed on Sep. 2, 1998, the entire contents of which are hereby incorporated by reference.

What is claimed is:

1. A predistorter of an amplifier for lowering adjacent-channel leakage power of an output of said amplifier, said predistorter comprising:

a first part which modifies in advance an input signal to be inputted into said amplifier by a reverse characteristic of an input-to-output characteristic of said amplifier; and a second part which determines correction coefficients corresponding to one or both of a differential and an integral of said modified input signal so as to further modify said input signal into a final predistortion signal based on said modified input signal and said correction coefficients.

2. The predistorter as claimed in claim 1, wherein said second part determines said correction coefficients so as to be able to remove a distortion caused by frequency characteristics of a bias circuit, frequency deviation, or high-frequency load characteristic deviation of said amplifier, or a combination of these factors.

3. A predistorter of an amplifier for lowering adjacent-channel leakage power of an output of said amplifier, said predistorter comprising:

a first part which modifies in advance an input signal to be inputted into said amplifier by a reverse characteristic of an input-to-output characteristic of said amplifier; and second part which determines correction coefficients corresponding to one or both of a differential and an integral of said modified input signal so as to further modify said input signal into a final predistortion signal based on said modified input signal and said correction coefficients, wherein said second part determines said correction coefficients based on a difference signal, instead of said one or both of said differential and integral of said input signal, said difference signal being generated between a previous value and a present value in a time series of said input signal.

4. A predistorter of an amplifier for lowering adjacent-channel leakage power of an output of said amplifier, said predistorter comprising:

a first part which modifies in advance an input signal to be inputted into said amplifier by a reverse characteristic of an input-to-output characteristic of said amplifier; and a second part which determines correction coefficients corresponding to one or both of a differential and an integral of said modified input signal so as to further modify said input signal into a final predistortion signal based on said modified input signal and said correction coefficients, wherein in advance, said second part determines said correction coefficients so as to match a pre-measured two-wavelength IMD characteristic, and stored in a memory.

5. An amplifying unit comprising:

an amplifier; and a predistorter of said amplifier for lowering adjacent-channel leakage power of an output of said amplifier, said predistorter comprising:.

a first part which modifies in advance an input signal to be inputted into said amplifier by a reverse characteristic of an input-to-output characteristic of said amplifier; and a second part which determines correction coefficients corresponding to one or both of a differential and an integral of said modified input signal so as to further modify said input signal into a final predistortion signal based on said modified input signal and said correction coefficients, wherein coefficients are determined according to output power of said amplifier, and by arithmetically processing the input signal and said coefficients, said input signal can be modified according to said output power of said amplifier.

6. An amplifying unit comprising:

an amplifier;

a feedback circuit; and a predistorter of said amplifier for lowering adjacent-channel leakage power of an output of said amplifier, said predistorter comprising:

a first part which modifies in advance an input signal to be inputted into said amplifier by a reverse characteristic of an input-to-output characteristic of said amplifier; and a second part which determines correction coefficients corresponding to one or both of a differential and an integral of said modified input signal so as to further modify said input signal into a final predistortion signal based on said modified input signal and said correction coefficients;

said feedback circuit monitoring a signal of a channel adjacent to an output signal of said amplifier and modifying coefficients of said predistorter so as to lower the level of said adjacent-channel signal.

7. An amplifying unit comprising:

an amplifier; and a predistorter of said amplifier for lowering adjacent-channel leakage power of an output of said amplifier, said predistorter comprising:

a first part which modifies in advance an input signal to be inputted into said amplifier by a reverse characteristic of an input-to-output characteristic of said amplifier; and a second part which determines correction coefficients corresponding to one or both of a differential and an integral of said modified input signal so as to further modify said input signal into a final predistortion signal based on said modified input signal and said correction coefficients, wherein an output current of said amplifier is monitored, and, in a case in which adjacent-channel leakage power is low, a value of power voltage or a bias is varied so as to lower a current value, so that efficiency of said amplifier can be improved in an allowable range of said adjacent-channel leakage power.

8. A predistorter for lowering adjacent-channel leakage power of an output from an amplifier, said predistorter comprising:

a first part which modifies in advance an input signal to be inputted into said amplifier by a reverse characteristic of an input-to-output characteristic of said amplifier; and a second part which arithmetically processes, in a case in which input power is increased and in another case in which said input power is decreased said modified input signal with respective different coefficients so as to form a predistortion signal.

* * * * *